(12) United States Patent
Krishnamurthy et al.

(10) Patent No.: US 11,289,352 B2
(45) Date of Patent: Mar. 29, 2022

(54) IN-SITU METROLOGY AND PROCESS CONTROL

(71) Applicant: Applied Materials, Inc., Santa Clara, CA (US)

(72) Inventors: Ramesh Krishnamurthy, Los Altos, CA (US); Lakshmanan Karuppiah, San Jose, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 172 days.

(21) Appl. No.: 16/662,625

(22) Filed: Oct. 24, 2019

(65) Prior Publication Data

US 2020/0335369 A1 Oct. 22, 2020

Related U.S. Application Data

(60) Provisional application No. 62/836,607, filed on Apr. 19, 2019.

(51) Int. Cl.

| | |
|---|---|
| *H01L 21/67* | (2006.01) |
| *G05B 19/418* | (2006.01) |
| *G01N 21/84* | (2006.01) |
| *G01N 21/35* | (2014.01) |
| *G01J 5/00* | (2022.01) |
| *G01B 11/06* | (2006.01) |
| *G01N 21/3563* | (2014.01) |
| *H01L 21/687* | (2006.01) |

(52) U.S. Cl.
CPC .... *H01L 21/67276* (2013.01); *G01B 11/0691* (2013.01); *G01J 5/0022* (2013.01); *G01N 21/3563* (2013.01); *G01N 21/84* (2013.01); *G05B 19/41875* (2013.01); *H01L 21/67253* (2013.01); *H01L 21/68764* (2013.01); *H01L 21/68771* (2013.01); *G01N 2021/3568* (2013.01); *G05B 2219/40066* (2013.01)

(58) Field of Classification Search
CPC ... G01B 11/0691; G01J 5/0022; G01N 21/84; G01N 21/3568; G05B 19/41875; G05B 2219/40066; H01L 21/67253; H01L 21/57276; H01L 21/68764; H01L 21/68771

See application file for complete search history.

(56) References Cited

U.S. PATENT DOCUMENTS

| | | | |
|---|---|---|---|
| 6,111,634 A | 8/2000 | Pecen et al. | |
| 6,447,370 B1 | 9/2002 | Weldon | |
| 7,102,763 B2 | 9/2006 | Ritzdorf et al. | |
| 2002/0142493 A1 | 10/2002 | Halliyal et al. | |

(Continued)

FOREIGN PATENT DOCUMENTS

KR 20160014196 A 2/2016

OTHER PUBLICATIONS

PCT International Search Report and Written Opinion in PCT/US2019/057860 dated Feb. 12, 2020, 15 pages.

*Primary Examiner* — Mark R Gaworecki
(74) *Attorney, Agent, or Firm* — Servilla Whitney LLC

(57) ABSTRACT

Methods and apparatus for the in-situ measurement of metrology parameters are disclosed herein. Some embodiments of the disclosure further provide for the real-time adjustment of process parameters based on the measure metrology parameters. Some embodiments of the disclosure provide for a multi-stage processing chamber top plate with one or more sensors between process stations.

16 Claims, 5 Drawing Sheets

(56) References Cited

U.S. PATENT DOCUMENTS

2004/0182422 A1 9/2004 Boyd et al.
2011/0174777 A1 7/2011 Jensen
2015/0128860 A1 5/2015 Canizares et al.

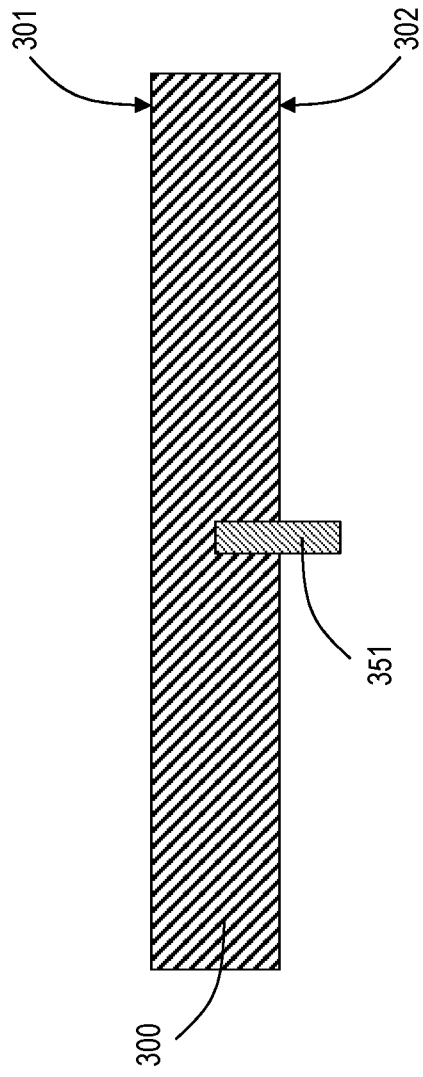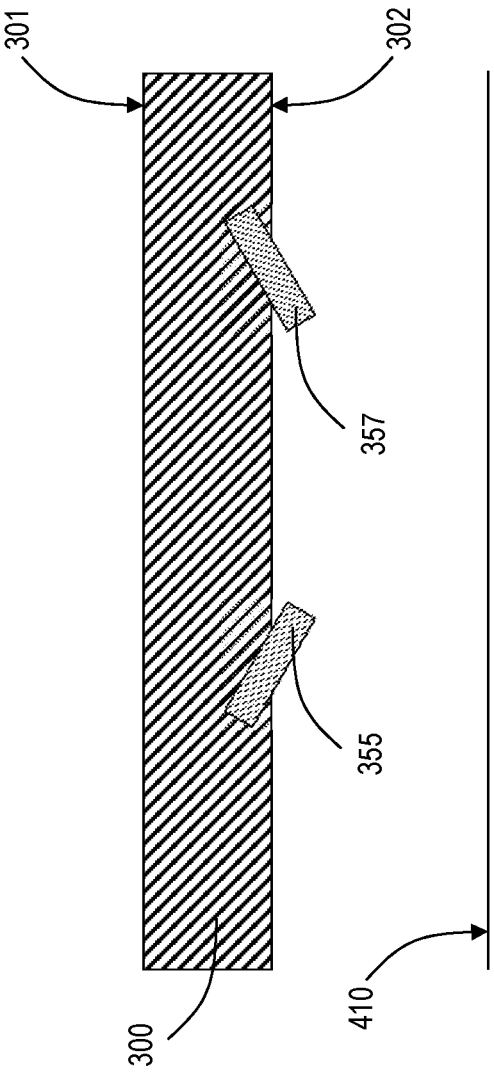
FIG. 4A
FIG. 4B

IN-SITU METROLOGY AND PROCESS CONTROL

CROSS-REFERENCE TO RELATED APPLICATIONS

This application claims priority to U.S. Provisional Application No. 62/836,607, filed Apr. 19, 2019, the entire disclosure of which is hereby incorporated by reference herein.

TECHNICAL FIELD

Embodiments of the present disclosure generally relate to apparatus and methods for deposition process control. Some embodiments integrate sensors into the process environment. Some embodiments measure parameters on a moving substrate.

BACKGROUND

Multi-station (MS) processing chambers represented a significant advancement over previous technologies. MS processing allows for the potential to process multiple wafers simultaneously. Similarly, separate processes can be performed in separate stations allowing complex deposition processes to be simplified onto a single deposition tool.

However, the transfer of these processes was complicated by the lack of available metrology measurement between processes. Intermediate measurements would require transfer to another chamber for metrology measurement. This decreased throughput and introduced potential contamination between chambers.

Accordingly, there is a need for in-situ measurement of metrology parameters.

SUMMARY

One or more embodiments of the disclosure are directed to a top plate for a multi-station processing chamber. The top plate comprises a top surface and a bottom surface defining a thickness. A plurality of openings extends through the thickness of the top plate. One or more sensors are positioned on the top plate between the plurality of openings. The sensors are configured to measure one or more parameters of a process occurring adjacent the bottom surface.

Additional embodiments of the disclosure are directed to a processing chamber comprising a housing with walls and a bottom. A top plate has a top surface and a bottom surface defining a thickness of the top plate. The top plate has a plurality of openings extending through the thickness. The housing and the top plate define an interior volume. A plurality of process stations are positioned within the plurality of openings in the top plate. The process stations define a processing volume adjacent a front face of the process station. A support assembly is within the interior volume. The support assembly comprises a top surface facing the bottom surface of the top plate and configured to support and rotate one or more substrate around a central axis of the support assembly to one or more of the processing volumes. One or more sensors are positioned on the top plate between the plurality of processing stations. The one or more sensors are configured to measure one or more parameters of a process occurring within the interior volume.

Further embodiments of the disclosure are directed to a method for measuring a substrate. The method comprises processing a substrate within a first process station of a processing chamber. The substrate is moved towards a second process station of the processing chamber. The substrate is measured during movement between the first process station and the second process station.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

FIG. 4A is a side view of a top plate with a perpendicular sensor in accordance with one or more embodiments of the disclosure;

FIG. 4B is a side view of a top plate with an emitter and a detector in accordance with one or more embodiments of the disclosure.

DETAILED DESCRIPTION

Figure 1:
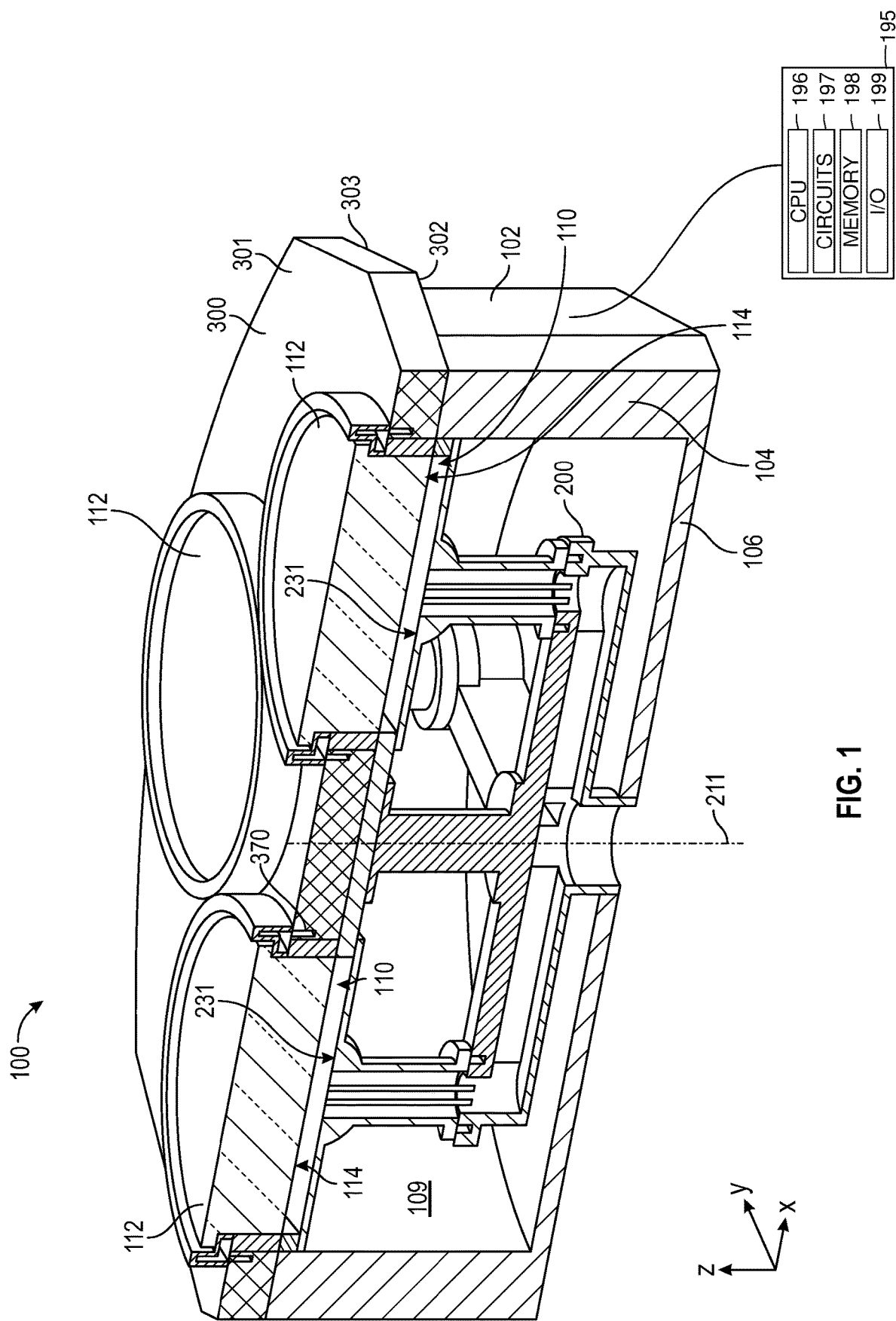
FIG. 1 is a cross-sectional view of an exemplary multi-stage processing chamber in accordance with one or more embodiments of the disclosure.

Before describing several exemplary embodiments of the disclosure, it is to be understood that the disclosure is not limited to the details of construction or process steps set forth in the following description. The disclosure is capable of other embodiments and of being practiced or being carried out in various ways.

As used in this specification and the appended claims, the term "substrate" refers to a surface, or portion of a surface, upon which a process acts. It will also be understood by those skilled in the art that reference to a substrate can also refer to only a portion of the substrate, unless the context clearly indicates otherwise. Additionally, reference to depositing on a substrate can mean both a bare substrate and a substrate with one or more films or features deposited or formed thereon.

A "substrate" as used herein, refers to any substrate or material surface formed on a substrate upon which measurement is performed. For example, a substrate surface on which measurement can be performed include materials such as silicon, silicon oxide, strained silicon, silicon on insulator (SOI), carbon doped silicon oxides, amorphous silicon, doped silicon, germanium, gallium arsenide, glass, sapphire, and any other materials such as metals, metal nitrides, metal alloys, and other conductive materials, depending on the application. Substrates include, without limitation, semiconductor wafers and support assembly surfaces.

Embodiments of the present disclosure relate to apparatus and methods for in-situ measuring of substrate metrology parameters and chamber health parameters during processing. Some embodiments of the disclosure further provide apparatus and methods for controlling processing parameters and film properties based on the measured metrology parameters.

Some embodiments of the disclosure advantageously provide for the real-time measurement of substrate or on-wafer parameters during the course of processing. Some embodiments of the disclosure advantageously provide for in-situ metrology measurement with no throughput impact. Some embodiments of the disclosure advantageously provide for the measurement of metrology parameters without breaking vacuum and/or at process conditions.

Without being bound by theory, it is believed that the real-time and/or in-situ measurement without vacuum break and/or at process conditions provides improved throughput as it is no longer necessary to transfer the wafer outside of the processing chamber for measurement.

Some embodiments of the disclosure advantageously provide for real-time process control, excursion detection and matching.

Some embodiments of the disclosure provide a system, process controller and/or software (e.g., computer-readable media) to allow for integration of metrology sensors into a process environment. Some embodiments provide a high integrity signal with high SNR (Signal to Noise Ratio). In some embodiments, the process controller and/or software provide a system to manipulate and analyze data to extract key parameters like thickness, material composition, temperature, morphology, etc., on a moving wafer.

Some embodiments of the disclosure provide a system which can measure at multiple points across the diameter of a wafer. The measurement can be done between process stations within a multi-station processing chamber. The measurement in some embodiments is performed in a non-processing section of the chamber.

While embodiments of the disclosure can be used with various types of processing chambers, a multi-station processing chamber is described herein. The skilled artisan will recognize that this is merely representative of one possible process chamber configuration and should not be taken as limiting the scope of the disclosure.

Figure 2:
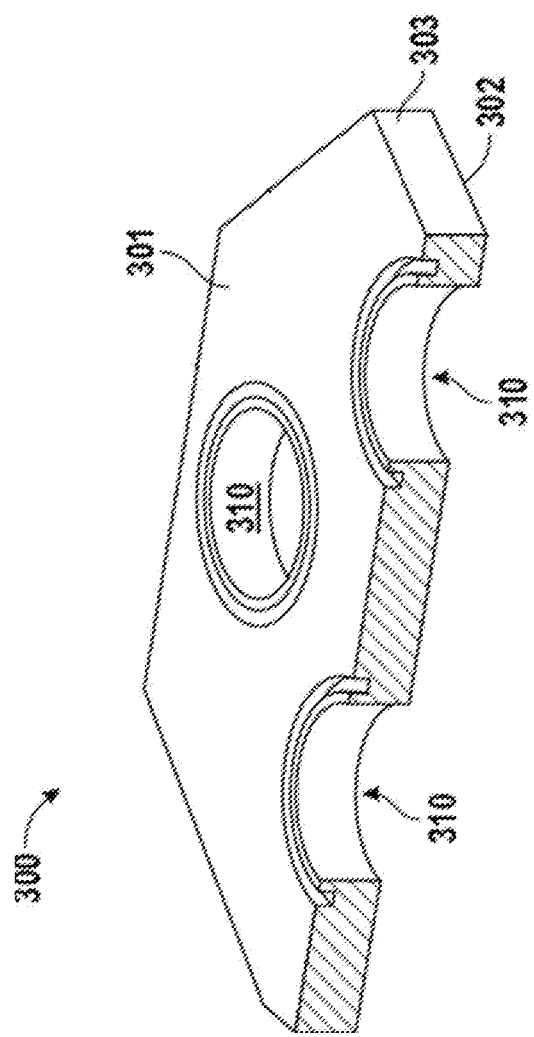
FIG. 2 is a top perspective view of an exemplary top plate in accordance with one or more embodiments of the disclosure.

FIGS. 1 and 2 illustrate a processing chamber 100 in accordance with one or more embodiment of the disclosure. Accordingly, some embodiments of the disclosure are directed to processing chambers 100 that incorporate a support assembly 200 and top plate 300. In some embodiments, the processing chamber 100 includes one or more sensors positioned to provide in-situ monitoring of deposition conditions/parameters.

Referring to FIGS. 1 and 2, the processing chamber 100 comprises a housing 102 with walls 104 and a bottom 106. The processing chamber 100 further comprises a top plate 300 having a top surface 301 and a bottom surface 302 defining a thickness of the top plate, and bounded by one or more edges 303. The top plate 300 includes a plurality of openings 310 extending through the thickness thereof. The housing 102 along with the top plate 300 define an interior volume 109.

The processing chamber 100 further comprises a plurality of process stations 112. The process stations 112 are positioned within the plurality of openings 310 in the top plate 300. In some embodiments, the process stations 112 are positioned in a circular arrangement around the rotational axis 211 of a support assembly 200. The process stations 112 define a processing volume 110 adjacent a front face 114 of the process station 112

Each process station 112 may comprises a gas injector. In some embodiments, the front faces 114 of each of the process stations 112 are substantially coplanar. The processing volume 110 is defined as a region in which processing can occur. For example, a processing volume 110 can be defined by the top surface 231 of the support assembly 200, as described below, and the front face 114 of the process station 112.

The process stations 112 can be configured to perform any suitable process and provide any suitable process conditions. The type of process station 112 used will depend on, for example, the type of process being performed including the type of showerhead or gas injector. For example, a process station 112 configured to operate as an atomic layer deposition apparatus may have a showerhead or vortex type gas injector. Whereas, a process station 112 configured to operate as a plasma station may have one or more electrode and/or grounded plate configuration to generate a plasma while allowing a plasma gas to flow toward the top surface 231 of the support assembly 200.

Suitable process stations 112 include, but are not limited to, thermal processing stations, microwave plasma, three-electrode CCP, ICP, parallel plate CCP, UV exposure, laser processing, pumping chambers, annealing stations and metrology stations. In some embodiments, one or more of the process stations 112 utilizes plasma. Stated differently, the process occurring within one or more of the processing volumes 110 utilizes plasma.

The processing chamber 100 further comprises a support assembly 200 within the interior volume 109. The support assembly comprises a top surface 231 facing the bottom surface 302 of the top plate 300. In some embodiments, the top surface 231 of the support assembly 200 is configured to support and rotate one or more substrate around a central axis 211 of the support assembly 200 to one or more of the processing volumes 110.

Figure 3:
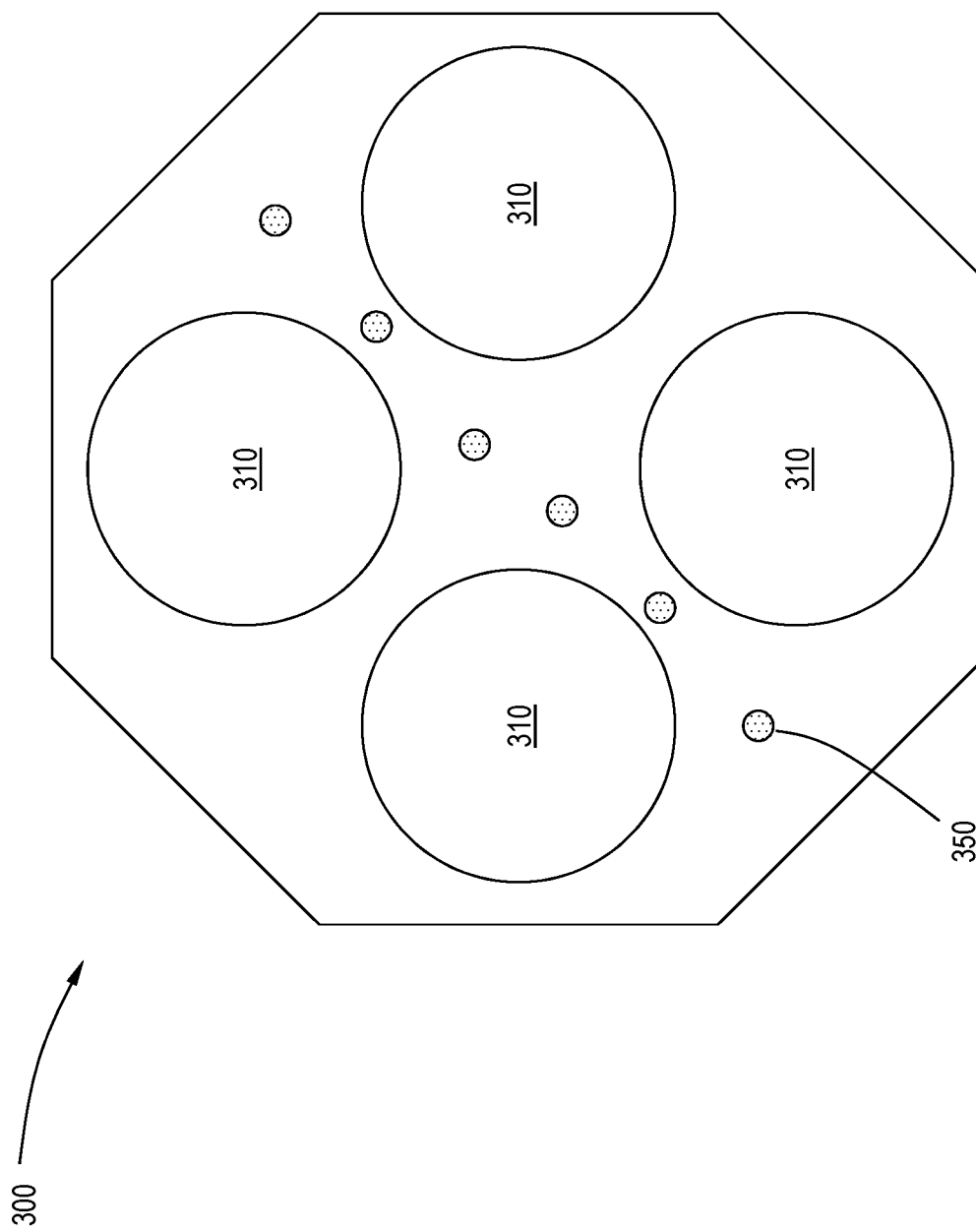
FIG. 3 is a top view of an exemplary top plate with sensors in accordance with one or more embodiments of the disclosure.

Referring to FIG. 3, the processing chamber 100 further comprises one or more sensors 350 positioned on the top plate 300. As used in this regard, "positioned on" means that the sensor 350 is in contact with the top surface 301 or bottom surface 302 of the top plate 300.

The one or more sensors 350 are positioned between the plurality of processing stations 112, located in openings 310. The processing stations 112 can include an outer wall to provide a physical barrier between the region inside the processing station and the region outside the processing station. The sensors 350 can then be located in the region outside the processing stations 112 to prevent contamination and for measurements taken after the process in the station has been performed. As shown in FIG. 3, in some embodiments, a plurality of sensors 350 are positioned on the top plate 300 and the plurality of sensors 350 are arranged radially.

The sensors 350 can be positioned on or mounted on the top plate 300, between processing stations 112, located along the motion path of a substrate moving between processing stations 112. In the embodiment illustrated in FIG. 3, there are six sensors 350, three each on opposite sides of the top plate. The sensors 350 can be located over the middle of the motion path, or the edge of the motion path, or anywhere appropriate for the individual sensor or measurement type.

In some embodiments, the sensor 350 is positioned at a single position on the top plate. Referring to FIG. 4A, in some embodiments, a perpendicular sensor 351 is oriented perpendicular or orthogonal to the bottom surface 302 of the top plate 300. The perpendicular sensor 351 is configured to both provide (emit) and receive (detect) electromagnetic radiation within the same sensor 350.

In some embodiments, the sensor 350 comprises an emitter 355 configured to emit electromagnetic radiation and a detector 357 configured to detect the electromagnetic radiation. Referring to FIG. 4B, in some embodiments, the emitter and the detector are positioned in separate locations and configured to form equal angles of reflection relative to a target surface 410. The target surface 410 is substantially parallel to the bottom surface of the top plate 300. As used in this regard, the term "substantially parallel" means that the parallelism of the components does not vary by more than 5% relative to the distance between the components.

In some embodiments, the angle of reflection is about 60°. Stated differently, in some embodiments, the emitter and detector are oriented at 60° off vertical. As shown in FIGS. 4A and 4B, in some embodiments, the one or more sensors 350 are positioned on the bottom surface 302 of the top plate.

Figure 5:
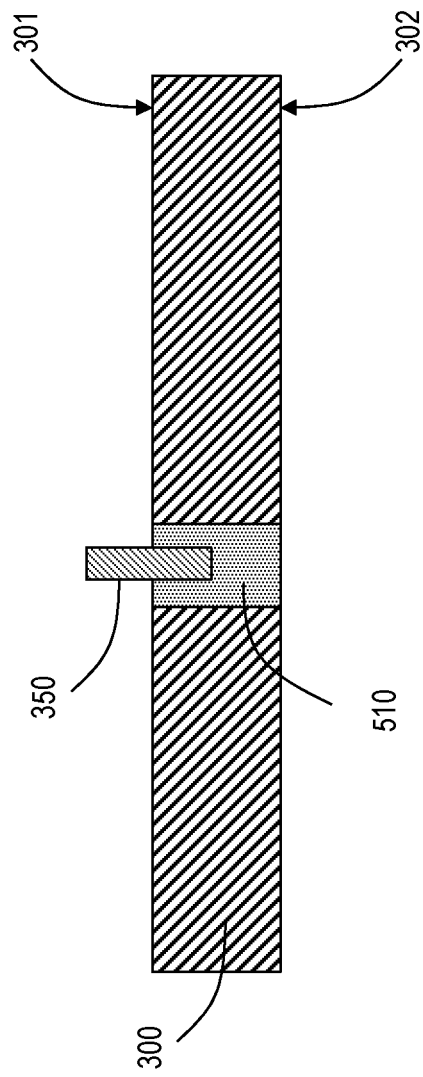
FIG. 5 is a side view of a top plate with a sensor and port in accordance with one or more embodiments of the disclosure.

Referring to FIG. 5, in some embodiments, the sensors 350 are located outside of the processing chamber 100. For example, the sensors 350 may be positioned on top surface 301 of the top plate 300 and take measurements through a port 510 or window. In some embodiments, the top plate 300 comprises one or more ports 510 extending through the thickness of the top plate 300. The sensors 350 may measure through the ports 510. The ports 510 can be made of any suitable material including, but not limited to, quartz.

The sensors can be any suitable sensors used for measuring properties of a substrate, wafer or film. The substrate, wafer or film may also be referred to as a target surface. Suitable sensors include, but are not limited to, reflectometry and ellipsometry measurements. In some embodiments, the one or more sensor 350 is an electromagnetic radiation sensor. As used in this regard, "an electromagnetic radiation" sensor relies on the emission and/or detection of wavelengths within the electromagnetic spectrum. In some embodiments, the one or more sensor 350 utilizes wavelengths in the infrared spectrum.

In some embodiments, the one or more sensor 350 is configured to measure one or more parameters of a process occurring within the interior volume 109. In some embodiments, the measured process occurs within a processing region 110. In some embodiments, the one or more sensor 350 is configured to measure one or more parameters of a process occurring adjacent the bottom surface 302 of the top plate 300. In some embodiments, the one or more sensor 350 is able to measure at least one of thickness, material composition, temperature or morphology of a substrate supported on the support assembly 200 during rotation.

Positioning the sensors 350 in a region between the processing stations 112 allows for an increase in the signal-to-noise ratio (SNR). A wafer can be moved in close proximity to the sensor 350 in the region between the processing stations 112.

In some embodiments, measurements using the various sensors 350 described herein can be done while the substrate is in motion. In some embodiments, measurements can be done without slowing the rotation of the support assembly 200. In some embodiments, the substrate takes about 0.5 seconds to move from one processing station 112 to the adjacent processing station 112 and the sensors 350 can measure the substrate parameters in that time frame. In some embodiments, the movement of the substrates is modulated to allow for more time to measure the substrate between processing stations 112.

The number of sensors can be varied depending on, for example, the number of points to be determined based on the metrology hardware and actual test results. The S/N ratio can be optimized by tuning the frequency of measurements being used. In some embodiments, there are in the range of about 1 to about 50 sensors. In some embodiments, there in the range of 1 to 12 sensors.

While the embodiments described above are described with respect to a processing chamber, additional embodiments of the disclosure are directed to the top plate 300.

Additional embodiments are directed to methods for measuring a substrate. The methods comprise processing a substrate within a first process station of a processing chamber. As described above, the first process station may be understood as a process station 112 of processing chamber 100.

After processing the substrate in the first process station, the substrate is moved towards a second process station of the processing chamber. For the avoidance of doubt, the first processing station and the second processing station are to be understood as separate processing stations in a multi-station processing chamber. Stated differently, the methods are performed in-situ, without breaking vacuum.

The method continues by measuring the substrate during movement between the first process station and the second process station. In some embodiments, measuring the substrate is performed with one or more sensor 350, described above.

Some embodiments of the disclosure are directed to a control system to receive feedback from one or more sensor and adjust deposition parameters in real-time. The control system can be integrated into the processing chamber 100 or can be a standalone system for analytics. Spectra from some types of sensors can be used to determine thickness profiles, temperature, etc., in real-time. This can allow for the feedback process controls, excursion detections and chamber/process matching.

In some embodiments, at least one controller 195 is coupled to one or more of the process stations 112, the one or more sensor 350, or the support assembly 200. In some embodiments, there are more than one controller 195 connected to the individual elements and a primary control processor is coupled to each of the separate processors to control the processing chamber 100. The controller 195 may be one of any form of general-purpose computer processor, microcontroller, microprocessor, etc., that can be used in an industrial setting for controlling various chambers and sub-processors.

The at least one controller 195 can have a processor 196, a memory 198 coupled to the processor 196, input/output devices 199 coupled to the processor 196, and support circuits 197 to communication between the different electronic components. The memory 198 can include one or more of transitory memory (e.g., random access memory) and non-transitory memory (e.g., storage).

The memory 198, or computer-readable medium, of the processor 196 may be one or more of readily available memory such as random access memory (RAM), read-only memory (ROM), floppy disk, hard disk, or any other form of digital storage, local or remote. The memory 198 can retain an instruction set that is operable by the processor 196 to control parameters and components of the processing chamber 100. The support circuits 197 are coupled to the processor 196 for supporting the processor in a conventional manner. Circuits may include, for example, cache, power supplies, clock circuits, input/output circuitry, subsystems, and the like.

Processes may generally be stored in the memory 198 as a software routine that, when executed by the processor 196, causes the process chamber 100 to perform processes of the present disclosure. The software routine may also be stored and/or executed by a second processor (not shown) that is remotely located from the hardware being controlled by the processor. Some or all of the method of the present disclosure may also be performed in hardware. As such, the process may be implemented in software and executed using a computer system, in hardware as, e.g., an application specific integrated circuit or other type of hardware implementation, or as a combination of software and hardware. The software routine, when executed by the processor 196, transforms the general purpose computer into a specific purpose computer (controller 195) that controls the chamber 100 operation such that the processes are performed.

In some embodiments, the controller 195 has one or more configurations to execute individual processes or sub-processes to perform the method. The controller 195 can be connected to and configured to operate intermediate components to perform the functions of the methods. For example, the controller 195 can be connected to and configured to control one or more of gas valves, actuators, motors, slit valves, vacuum control, etc.

The controller 195 of some embodiments has one or more configurations selected from: a configuration to move a substrate between the plurality of process stations; a configuration to control process parameters within the process stations; a configuration to receive input from the one or more sensors; and a configuration to interpret the input to adjust process parameters within the process stations.

Some embodiments of the disclosure are directed to methods for controlling a processing chamber. The methods comprise processing a substrate within a first process station of a processing chamber. As described above, the first process station may be understood as a process station 112 of processing chamber 100.

After processing the substrate in the first process station, the substrate is moved towards a second process station of the processing chamber. For the avoidance of doubt, the first processing station and the second processing station are to be understood as separate processing stations in a multi-station processing chamber. Stated differently, in some embodiments, the methods are performed in-situ, without breaking vacuum. In some embodiments, the temperature of the substrate is maintained.

The method continues by measuring the substrate during movement between the first process station and the second process station to determine a parameter of the substrate. In some embodiments, measuring the substrate is performed with one or more sensor 350, described above.

After measuring the substrate, a process condition of the first process station and/or the second process station is modified in response to the measured parameter of the substrate. In some embodiments, the time between measurement of the substrate and modification of the process condition is relatively short. As used in this regard, "relatively short" means a period of time less than or equal to about 5 seconds, less than or equal to about 2 seconds, less than or equal to about 1 second or less than or equal to about 0.5 seconds. Stated differently, in some embodiments, modification of the process parameter is performed in real-time.

Reference throughout this specification to "one embodiment," "certain embodiments," "one or more embodiments" or "an embodiment" means that a particular feature, structure, material, or characteristic described in connection with the embodiment is included in at least one embodiment of the disclosure. Thus, the appearances of the phrases such as "in one or more embodiments," "in certain embodiments," "in one embodiment" or "in an embodiment" in various places throughout this specification are not necessarily referring to the same embodiment of the disclosure. Furthermore, the particular features, structures, materials, or characteristics may be combined in any suitable manner in one or more embodiments.

Although the disclosure herein has been described with reference to particular embodiments, those skilled in the art will understand that the embodiments described are merely illustrative of the principles and applications of the present disclosure. It will be apparent to those skilled in the art that various modifications and variations can be made to the method and apparatus of the present disclosure without departing from the spirit and scope of the disclosure. Thus, the present disclosure can include modifications and variations that are within the scope of the appended claims and their equivalents.

What is claimed is:

1. A top plate for a multi-station processing chamber, the top plate comprising:
   a top surface and a bottom surface defining a thickness;
   a plurality of openings extending through the thickness of the top plate; and
   one or more sensors positioned on the top plate between the plurality of openings, the sensors configured to measure one or more parameters of a process occurring adjacent the bottom surface, at least one of the one or more sensors comprises an emitter configured to emit an electromagnetic radiation and a detector configured to detect the electromagnetic radiation.

2. The top plate of claim 1, wherein the one or more sensors are electromagnetic radiation sensors.

3. The top plate of claim 1, wherein at least one of the one or more sensors is oriented perpendicular to the bottom surface of the top plate.

4. The top plate of claim 1, wherein the emitter and the detector are positioned in separate locations and configured to form equal angles of reflection relative to a target surface.

5. The top plate of claim 1, further comprising one or more ports extending through the thickness of the top plate.

6. The top plate of claim 5, wherein the one or more sensors are positioned on the top surface of the top plate.

7. The top plate of claim 1, wherein the one or more sensors are positioned on the bottom surface of the top plate.

8. The top plate of claim 1, wherein the one or more sensors are configured to measure one or more of thickness, material composition, temperature, or morphology of a target surface.

9. The top plate of claim 1, wherein the one or more sensors is configured to measure one or more parameters of a target surface in motion.

10. A processing chamber comprising:
    a housing with walls and a bottom;
    a top plate having a top surface and a bottom surface defining a thickness of the top plate, the top plate having a plurality of openings extending through the thickness, the housing and the top plate defining an interior volume;
    a plurality of process stations positioned within the plurality of openings in the top plate, each process station defining a processing volume adjacent a front face of the process station;
    a support assembly within the interior volume, the support assembly comprising a top surface facing the bottom surface of the top plate and configured to support and rotate one or more substrate around a central axis of the support assembly to one or more of the processing volumes; and one or more sensors positioned on the top plate between the plurality of processing stations, the one or more sensors configured to measure one or more parameters of a process occurring within the interior volume.

11. The processing chamber of claim 10, wherein a process occurring within one or more of the processing volumes utilizes plasma.

12. The processing chamber of claim 10, wherein at least one of the one or more sensors is an electromagnetic radiation sensor.

13. The processing chamber of claim 10, wherein the at least one of the one or more sensors is oriented perpendicular to the bottom surface of the top plate.

14. The processing chamber of claim 10, at least one of the one or more sensors comprises an emitter configured to emit electromagnetic radiation and a detector configured to detect the electromagnetic radiation, the emitter and the detector positioned in separate locations and configured to form equal angles of reflection relative to a target surface.

15. The processing chamber of claim 10, wherein the one or more sensors are able to measure at least one of thickness, material composition, temperature or morphology of the substrate.

16. The processing chamber of claim 10, wherein the substrate is in motion while being measured by the one or more sensors.

* * * * *